(12) United States Patent
Guo et al.

(10) Patent No.: US 11,342,460 B2
(45) Date of Patent: May 24, 2022

(54) THIN FILM TRANSISTOR, METHOD FOR FABRICATING THE SAME, ARRAY SUBSTRATE, DISPLAY PANEL AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Zhixuan Guo, Beijing (CN); Fengguo Wang, Beijing (CN); Yezhou Fang, Beijing (CN); Xinguo Wu, Beijing (CN); Hong Liu, Beijing (CN); Kai Li, Beijing (CN); Liang Tian, Beijing (CN); Shiyu Zhang, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 105 days.

(21) Appl. No.: 16/601,991

(22) Filed: Oct. 15, 2019

(65) Prior Publication Data

US 2020/0303560 A1    Sep. 24, 2020

(30) Foreign Application Priority Data

Mar. 19, 2019 (CN) .......................... 201910207115.0

(51) Int. Cl.
*H01L 29/786* (2006.01)
*H01L 29/66* (2006.01)

(52) U.S. Cl.
CPC .. *H01L 29/78621* (2013.01); *H01L 29/66757* (2013.01); *H01L 29/78627* (2013.01); *H01L 2029/7863* (2013.01)

(58) Field of Classification Search
CPC ............. H01L 29/786; H01L 29/78621; H01L 29/78627; H01L 29/66; H01L 29/66757;
(Continued)

(56) References Cited

U.S. PATENT DOCUMENTS

2002/0125535 A1   9/2002  Ueda
2003/0053791 A1*  3/2003  Yoshida ............ G02F 1/133553
                                                             385/147

(Continued)

FOREIGN PATENT DOCUMENTS

CN      1893117 A     1/2007
CN    104282696 A     1/2015
CN    108565247 A     9/2018

OTHER PUBLICATIONS

Office Action for corresponding Chinese Application No. 201910207115.0 dated Aug. 9, 2021.

*Primary Examiner* — Thanh T Nguyen
(74) *Attorney, Agent, or Firm* — ArentFox Schiff LLP; Michael Fainberg

(57) ABSTRACT

A thin film transistor, a method for fabricating the same, an array substrate, a display panel, and a display device are provided. The thin film transistor includes a substrate, and an active layer on the substrate, wherein the active layer includes a poly-silicon layer and has a channel region and two electrode connection regions respectively on two sides of the channel region, and the channel region includes a plurality of lightly drain doping segments, which are spaced apart along from one of the electrode connection regions to the other electrode connection region, and channel segments located between the lightly drain doping segments.

11 Claims, 2 Drawing Sheets

(58) Field of Classification Search
CPC ....... H01L 2029/7863; H01L 29/78696; H01L 29/66765; H01L 29/78675
See application file for complete search history.

(56) References Cited

U.S. PATENT DOCUMENTS

| | | |
|---|---|---|
| 2007/0001225 A1 | 1/2007 | Ohnuma et al. |
| 2009/0061548 A1* | 3/2009 | Cheng ................ H01L 27/1288 438/22 |
| 2013/0328053 A1 | 12/2013 | Roudbari et al. |
| 2016/0260840 A1 | 9/2016 | Xie |

* cited by examiner

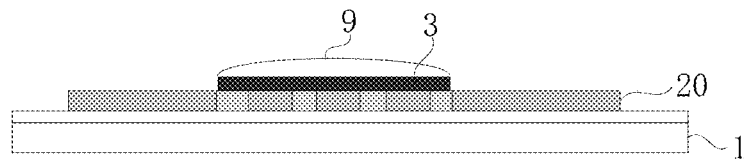
Fig.5
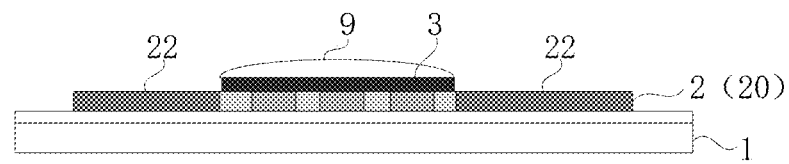
Fig.6
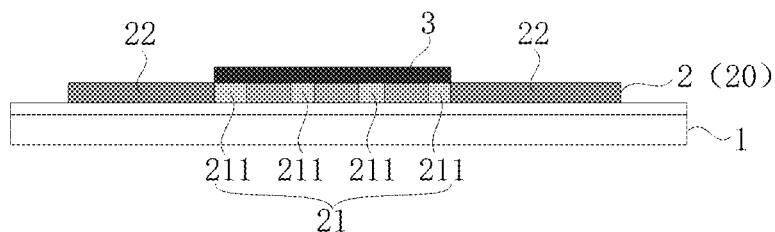
Fig.7
| Form the poly-silicon layer on the substrate, and form a pattern of the active layer in a first patterning process | ~101 |
↓
| Lightly dope the poly-silicon layer using a mask to form the lightly drain doping segments that are spaced apart | ~102 |
Fig.8

THIN FILM TRANSISTOR, METHOD FOR FABRICATING THE SAME, ARRAY SUBSTRATE, DISPLAY PANEL AND DISPLAY DEVICE

CROSS-REFERENCES TO RELATED APPLICATION

This application claims priority to Chinese patent application No. 201910207115.0 filed on Mar. 19, 2019, which is incorporated herein by reference in its entirety.

FIELD

The present disclosure relates to the field of display technologies, and particularly to a thin film transistor, a method for fabricating the same, an array substrate, a display panel, and a display device.

BACKGROUND

A significant drawback of a Low-Temperature Poly-Silicon Thin Film Transistor (LTPS TFT) lies in that leakage current or off-state current cannot be suppressed effectively. Generally the leakage current in the LTPS TFT may be tens to hundreds of times that amorphous silicon, and the good yield ratio of the LTPS TFT may drop by 17% due to the leakage current. The current trend of new product is low power consumption, which requires a lower refresh rate and smaller leakage current, so how to effectively suppress the generation of the leakage current is one important research on the LTPS TFT.

SUMMARY

In one aspect, an embodiment of the disclosure provides a thin film transistor. The thin film transistor includes: a substrate, and an active layer on the substrate, wherein the active layer includes a poly-silicon layer and has a channel region and two electrode connection regions respectively on two sides of the channel region, and the channel region includes a plurality of lightly drain doping segments spaced apart along from one of the electrode connection regions to the other electrode connection region, and channel segments between the lightly drain doping segments.

In some embodiments, the two electrode connection regions are heavily drain doping regions.

In some embodiments, two ends of the channel region, which are connected with the two electrode connection regions, are two lightly drain doping segments.

In some embodiments, the widths of the two lightly drain doping segments at the two ends of the channel region are larger than the widths of the lightly drain doping segments in the middle of the channel region.

In some embodiments, the widths of the lightly drain doping segments in the middle of the channel region are equal.

In some embodiments, the channel region includes four lightly drain doping segments.

In some embodiments, widths of the channel segments are equal.

In some embodiments, the ratio of the width of the lightly drain doping segment to the width of a channel segment in the channel region is less than 1.

In some embodiments, the thin film transistor further includes a gate on the active layer, and orthographic projections of two ends of the gate on the substrate are aligned respectively with orthographic projections of two ends of the channel region, which are connected with the two electrode connection regions, on the substrate.

In another aspect, an embodiment of the disclosure provides an array substrate including the thin film transistor according to any one of the technical solutions above.

In still another aspect, an embodiment of the disclosure provides a display panel including the array substrate according to the technical solution above.

In still another aspect, an embodiment of the disclosure provides a display device including the display panel according to the technical solution above.

In still another aspect, an embodiment of the disclosure provides a method for fabricating the thin film transistor according to any one of the technical solutions above. The method includes: forming the poly-silicon layer on the substrate, and forming a pattern of the active layer in a first patterning process; and lightly doping the poly-silicon layer using a mask to form the lightly drain doping segments that are spaced apart.

In some embodiments, after forming the lightly drain doping segments that are spaced apart, the method further includes: forming a metal layer on the poly-silicon layer, and forming a pattern of a gate in a second patterning process, wherein orthographic projections of two ends of the gate on the substrate are aligned respectively with orthographic projections of the two ends of the channel region, which are connected with the two electrode connection regions, on the substrate; and heavily doping the poly-silicon layer using the gate, or photo-resist reserved in the second patterning process as a mask so that the two electrode connection regions become heavily drain doping regions.

BRIEF DESCRIPTION OF THE DRAWINGS

FIG. 5 is a schematic structural diagram of the thin film transistor after the gate is formed on the poly-Si layer according to the embodiment of the disclosure;

FIG. 6 is a schematic structural diagram of the thin film transistor after the heavily drain doping regions are formed in the poly-Si layer according to the embodiment of the disclosure;

FIG. 7 is a schematic structural diagram of the thin film transistor after photo-resist on the gate is stripped according to the embodiment of the disclosure; and FIG. 8 is a flow chart of a method for fabricating a thin film transistor according to an embodiment of the disclosure.

DETAILED DESCRIPTION

The technical solutions according to the embodiments of the disclosure will be described below clearly and fully with reference to the drawings in the embodiments of the disclosure. Apparently the embodiments to be described are only a part but not all of the embodiments of the disclosure. Based upon the embodiments here of the disclosure, all of other embodiments which can occur to those ordinarily skilled in the art without any inventive effort shall come into the claimed scope of the disclosure.

Embodiments of the invention provide a thin film transistor, a method for fabricating the same, an array substrate, a display panel, and a display device so as to improve the performance and the good yield ratio of the LTPS TFT.

Figure 1:
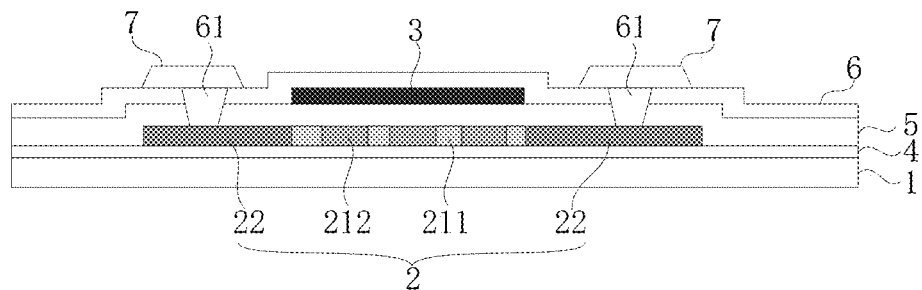
FIG. 1 is a schematic structural diagram of a thin film transistor according to an embodiment of the disclosure.

In one aspect, as illustrated in FIG. 1 and FIG. 7, an embodiment of the disclosure provides a Thin Film Transistor (TFT). The TFT includes a substrate 1, and an active layer 2 on the substrate 1, where the active layer 2 includes a poly-silicon layer and has a channel region 21 and two electrode connection regions 22 respectively on two sides of the channel region 21. The channel region 22 includes a plurality of Lightly drain doping (LDD) segments 211 spaced apart along from one of the electrode connection regions 22 to the other electrode connection region 22 and channel segments 212 between the lightly drain doping segments.

In the thin film transistor above (Poly-Si TFT), the plurality of LDD segments 211 are formed in the channel region 21, thus a plurality of resistors are connected in series in the TFT switch, so that an electric field in the horizontal direction is lowered, thereby reducing hot carrier probability generated by the impact ionization caused by the electric field acceleration, thus suppressing leakage current from being generated, to some extent. The LDD segments 211 are arranged to create multiple segments of potential barrier for buffering potential to thereby further reduce hot carrier probability generated by the impact ionization caused by the electric field acceleration, thus further suppressing leakage current from being generated. In summary, there is small leakage current in the TFT above with a high good yield ratio.

Specifically as illustrated in FIG. 1, the channel segments 212, and the lightly drain doping segments 211 are arranged alternately in the channel region 21, that is, the channel region 21 includes the plurality of channel segments 212 that are spaced apart.

As illustrated in FIG. 1 and FIG. 7, in some embodiments, the two electrode connection regions 22 are heavily drain doping regions.

Furthermore two ends of the channel region 21, which are connected with the two electrode connection regions 22, are two the lightly drain doping regions 211, and the respective regions at the active layer 2 are the heavily drain doping region, the lightly drain doping segment 211, the channel segment 212, the lightly drain doping segment 211, the channel segment 212, the lightly drain doping segment 211, and the heavily drain doping region successively from one of the electrode connection regions 22 to the other electrode connection region 22. In this way, the two lightly drain doping segments 21 at the two ends of the channel region 21 can be transition regions between the two heavily drain doping regions respectively and the channel segments 212.

By way of an example, the channel region 21 can include four lightly drain doping segments 211, and in this way, the respective regions in the active layer 2 are the heavily drain doping region, the lightly drain doping segment 211, the channel segment 212, the lightly drain doping segment 211, the channel segment 212, the lightly drain doping segment 211, the channel segment 212, the lightly drain doping segment 211, and the heavily drain doping region successively from one of the electrode connection regions 22 to the other electrode connection region 22.

By way of an example, the widths of the two lightly drain doping segments 211 at the two ends of the channel region 21 can be larger than the widths of the respective lightly drain doping segments 211 in the middle, that is, the widths of the two lightly drain doping segments 211, which are transition regions, are larger, to thereby effectively lower an electric field between the heavily drain doping regions and the channel segments 212, so as to effectively suppress the leakage current from being generated. For example, the "width" as described in the embodiment of the disclosure refers to a size from one of the electrode connection regions 22 to the other electrode connection region 22.

By way of an example, the widths of the respective lightly drain doping segments 211 in the middle of the channel region 21 are equal. Furthermore the spacing between adjacent lightly drain doping segments 211 is uniform, that is, the widths of the channel segments 212 are equal. In this way, there may be equal potential differences between the barrier segments for a better effect of buffering the potential, and thus a better effect of suppressing the leakage current.

By way of an example, the ratio of the width of the lightly drain doping segment 211 to the spacing between the adjacent lightly drain doping segments 211 in the channel region 21 is less than 1, that is, the ratio of the width of the lightly drain doping segment 211 to the width of a channel segment 212 is less than 1, or the width of each channel segment 212 is larger than the width of each lightly drain doping segment 211.

As illustrated in FIG. 1 and FIG. 7, in some embodiments, the TFT according to the embodiment of the disclosure can further include a gate 3 on the active layer 2, where orthographic projections of two ends of the gate 3 on the substrate 1 are aligned respectively with orthographic projections of the two ends of the channel region 21 on the substrate 1.

In this way, the gate 3, or photo-resist reserved in a patterning process of gate 3 can be used as a mask for protecting the channel region 21, and the two electrode connection regions 22 in the active layer 2 can be further heavily drain doped directly.

In some embodiments, as illustrated in FIG. 1, the TFT according to the embodiment of the disclosure can further include a buffer layer 4 between the substrate 1 and the active layer 2, a gate insulation layer (GI) 5 between the active layer 2 and the gate 3, and a dielectric layer (ILD) 6 and source and drain electrodes (SD) 7 stacked successively on the gate 3; and specifically via-holes 61 are formed in the dielectric layer 6, and the source and drain electrodes 7 are electrically connected respectively with the two electrode connection regions 22 through the via-holes 61.

Of course, in the TFT according to the embodiment of the disclosure, the gate 3 can alternatively be arranged below the active layer 2, thus resulting in a bottom-gate TFT structure.

In another aspect, an embodiment of the disclosure further provides an array substrate including the thin film transistor according to any one of the embodiments above of the disclosure.

In still another aspect, an embodiment of the disclosure further provides a display panel including the array substrate according to the embodiment above of the disclosure, or the thin film transistor according to any one of the embodiments above of the disclosure.

Specifically the display panel can be an Active-Matrix Organic Light-Emitting Diode (AMOLED), or can be a Liquid Crystal Display (LCD) panel.

In a further aspect, an embodiment of the disclosure further provides a display device including the display panel according to the embodiment above of the disclosure.

Since the leakage current in the poly-Si TFT according to the embodiment of the disclosure can be suppressed from being generated and thus effectively lowered, the good yield ratio of the LTPS TFT can be improved effectively to thereby improve the good yield ratio of the array substrate, the display panel, and the display device; and since the leakage current in the TFT is lowered, the array substrate, the display panel, and the display device according to the embodiments of the disclosure can better cater to the developing new display products with low power consumption, and thus will be highly competitive.

In a further aspect, an embodiment of the disclosure further provides a method for fabricating the thin film transistor according to any one of the embodiments above of the disclosure. As illustrated in FIG. 8, the method includes the following steps.

Figure 2:
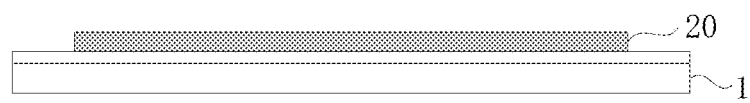
FIG. 2 is a schematic structural diagram of the thin film transistor after a poly-Si layer is formed according to the embodiment of the disclosure.

The step 101 is to form the poly-Si layer 20 on the substrate 1, and to form a pattern of the active layer in a first patterning process, as illustrated in FIG. 2.

Figure 3:
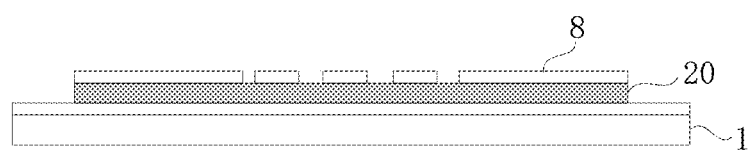
FIG. 3 is a schematic structural diagram of the thin film transistor after a mask is arranged on the poly-Si layer according to the embodiment of the disclosure.
Figure 4:
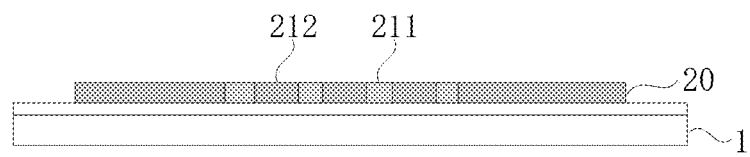
FIG. 4 is a schematic structural diagram of the thin film transistor after lightly drain doping segments are formed in the poly-Si layer according to the embodiment of the disclosure.

The step 102 is to lightly dope the poly-Si layer 20 using a mask 8 to form a plurality of lightly drain doping segments 211 that are spaced apart, as illustrated in FIG. 3 and FIG. 4, where the lightly drain doping segments 211 are formed so that the channel segments 212 are also determined.

In some embodiments, after the step 102 of forming the lightly drain doping segments 211 that are spaced apart, the method can further include the following steps.

The step 103 is to form a metal layer on the poly-Si layer 20, and to form a pattern of a gate 3 in a second patterning process, as illustrated in FIG. 5, where orthographic projections of two ends of the gate 3 on the substrate 1 are aligned respectively with orthographic projections of the two ends of the channel region 21, which are connected with the two electrode connection regions 22, on the substrate 1.

The step 104 is to heavily dope the poly-Si layer 20 using the gate 3 as a mask so that the two electrode connection regions 22 are heavily drain doping regions, as illustrated in FIG. 7, or to heavily dope the poly-Si layer 20 using photo-resist 9 reserved in the second patterning process as a mask so that the two electrode connection regions 22 are heavily drain doping regions, and to remove the photo-resist 9 after the heavy doping process, as illustrated in FIG. 6.

By way of an example, the step 101 can further include doping the entire poly-Si layer 20 to adjust threshold voltage (Vth) of the TFT.

By way of an example, as illustrated in FIG. 1, the method for fabricating the thin film transistor according to the embodiment of the disclosure can further include the following steps:

Forming a light-shielding layer (LS) and a buffer layer 4 before the step 101;

Forming a gate insulation layer (GI) 5 between the step 102 and the step 103; and Forming a dielectric layer 6 and source and drain electrodes (SD) 7 after the step 104.

By way of an example, in order to fabricate an array substrate, a planarization layer (PLN), common electrodes (C-ITO), an insulation layer, pixel electrodes (P-ITO), etc., can be further formed successively on an array of TFTs.

In the method for forming a poly-Si TFT according to the embodiment of the disclosure, the lightly doped segments are formed in the channel region of the TFT using a Lightly Drain Doping (LDD) mask to thereby form the poly-Si TFT with an effect of suppressing leakage current, so that on one hand, the good yield ratio of the LTSP TFT can be improved effectively to thereby improve the good yield ratio of the array substrate, the display panel, and the display device, and on the other hand, they can better cater to the developing new display products with low power consumption, and thus will be highly competitive.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A thin film transistor, comprising:
a substrate;
an active layer on the substrate, wherein the active layer comprises a poly-silicon layer and has a channel region and two electrode connection regions respectively on two sides of the channel region, and the channel region comprises a plurality of lightly drain doping segments, which are spaced apart along from one of the electrode connection regions to the other electrode connection region, and channel segments between the lightly drain doping segments; and
a gate on the active layer, wherein orthographic projections of two ends of the gate on the substrate are aligned respectively with orthographic projections of two ends of the channel region, which are connected with the two electrode connection regions, on the substrate;
wherein an orthographic projection of the gate on the substrate completely cover an orthographic projection of the channel region comprising the lightly drain doping segments and the channel segments; and
the orthographic projection of the gate on the substrate does not overlap with orthographic projections of the two electrode connection regions.

2. The thin film transistor according to claim 1, wherein the two electrode connection regions are heavily drain doping regions.

3. The thin film transistor according to claim 2, wherein two ends of the channel region, which are connected with the two electrode connection regions, are two lightly drain doping segments.

4. The thin film transistor according to claim 3, wherein widths of the two lightly drain doping segments at the two ends of the channel region are larger than widths of the lightly drain doping segments in a middle of the channel region.

5. The thin film transistor according to claim 4, wherein the widths of the lightly drain doping segments in the middle of the channel region are equal.

6. The thin film transistor according to claim 3, wherein the channel region comprises four lightly drain doping segments.

7. The thin film transistor according to claim 1, wherein widths of the channel segments are equal.

8. The thin film transistor according to claim 7, wherein a ratio of a width of the lightly drain doping segment to a width of the channel segment in the channel region is less than 1.

9. An array substrate, comprising the thin film transistor according to claim 1.

10. A display panel, comprising the array substrate according to claim 9.

11. A display device, comprising the display panel according to claim 10.

* * * * *